(12) United States Patent
Sato

(10) Patent No.: US 8,797,760 B2
(45) Date of Patent: Aug. 5, 2014

(54) SUBSTRATE, ELECTRONIC DEVICE, AND ELECTRONIC APPARATUS

(75) Inventor: Kenji Sato, Matsumoto (JP)

(73) Assignee: Seiko Epson Corporation (JP)

( * ) Notice: Subject to any disclaimer, the term of this patent is extended or adjusted under 35 U.S.C. 154(b) by 138 days.

(21) Appl. No.: 13/560,039

(22) Filed: Jul. 27, 2012

(65) Prior Publication Data

US 2013/0033838 A1 Feb. 7, 2013

(30) Foreign Application Priority Data

Aug. 1, 2011 (JP) ................................. 2011-168570

(51) Int. Cl.
*H05K 7/00* (2006.01)

(52) U.S. Cl.
USPC ........... 361/777; 361/760; 361/778; 361/779; 174/267

(58) Field of Classification Search
USPC .................. 361/777, 760, 778, 779; 174/267
See application file for complete search history.

(56) References Cited

U.S. PATENT DOCUMENTS

| | | | |
|---|---|---|---|
| 6,787,927 B2 | 9/2004 | Horibe | |
| 7,236,373 B2 * | 6/2007 | Uchida et al. | 361/763 |
| 8,125,789 B2 * | 2/2012 | Nishimura | 361/767 |
| 2004/0179344 A1 * | 9/2004 | Uchida et al. | 361/777 |
| 2012/0085575 A1 * | 4/2012 | Yamamoto et al. | 174/267 |

FOREIGN PATENT DOCUMENTS

| | | |
|---|---|---|
| JP | 08-307153 | 11/1996 |
| JP | 2001-210749 | 8/2001 |
| JP | 2002-237549 | 8/2002 |
| JP | 2003-218259 | 7/2003 |
| JP | 2003-240554 | 8/2003 |
| JP | 2009-099665 | 5/2009 |

* cited by examiner

*Primary Examiner* — Andargie M Aychillhum

(74) *Attorney, Agent, or Firm* — Harness, Dickey & Pierce, P.L.C.

(57) ABSTRACT

A substrate includes: a base; and a plurality of bonding terminals arranged on at least one surface of the base, wherein the plurality of bonding terminals include a first bonding terminal and a second bonding terminal, the first bonding terminal and the second bonding terminal include, in plan view of the base, a circle contacting portion extending along the circumference of a circle tangent to the first bonding terminal and the second bonding terminal, all of the plurality of bonding terminals are arranged so as not to protrude from an area including the circle and the inside thereof, and the circle contacting portion includes at least a first circle contacting portion disposed in the first bonding terminal and a second circle contacting portion disposed in the second bonding terminal.

11 Claims, 11 Drawing Sheets

SUBSTRATE, ELECTRONIC DEVICE, AND ELECTRONIC APPARATUS

BACKGROUND

1. Technical Field

The present invention relates to a substrate, an electronic device, and an electronic apparatus.

2. Related Art

Heretofore, electronic devices in which a functional element, such as a gyro element, and an IC (Integrated Circuit) chip which performs the driving or the like of the functional element are disposed within a casing have been known. The electronic device has external mounting terminals on a rear surface of the casing, and is mounted on a mounting board via the external mounting terminals (refer to JP-A-2009-99665 (Patent Document 1)).

On a rear surface of a ceramic package of Patent Document 1, main electrode patterns and sub-electrode patterns are formed as external mounting terminals. Mounting of the ceramic package on a mounting board is performed by bonding the main electrode patterns and the sub-electrode patterns with the mounting board via solder.

The mounting board is usually composed of a glass epoxy board or the like and different in coefficient of thermal expansion from the ceramic package. Therefore, in a state where the ceramic package is mounted on the mounting board, stress acts, with temperature rising, on the interface between the solder and the external mounting terminal.

As shown in FIG. 11, portions on which the stress acts most greatly in the ceramic package of Patent Document 1 are places of the sub-electrode patterns formed at corner portions, the places being indicated by reference signs M (places most separated from a center O' of a circle circumscribing the four sub-electrode patterns).

However, in the ceramic package of Patent Document 1, since the place indicated by the reference sign M is a "point", the stress acts concentratedly on the place, resulting in a problem that a crack beginning at the place occurs in the bonding material (solder).

SUMMARY

An advantage of some aspects of the invention is to provide a substrate which can prevent or suppress the occurrence of a crack in a bonding material such as solder caused by applied stress in a state of being mounted on a mounting board via the bonding material, an electronic device, and an electronic apparatus.

Application Example 1

This application example of the invention is directed to a substrate including: a base; and a plurality of bonding terminals arranged on at least one surface of the base, wherein the plurality of bonding terminals include a first bonding terminal and a second bonding terminal, the first bonding terminal and the second bonding terminal include, in plan view of the base, a circle contacting portion extending along the circumference of a circle tangent to the first bonding terminal and the second bonding terminal, all of the plurality of bonding terminals are arranged so as not to protrude from an area including the circle and the inside thereof, and the circle contacting portion includes at least a first circle contacting portion disposed in the first bonding terminal and a second circle contacting portion disposed in the second bonding terminal.

With this configuration, stress can be received by "line" at the circle contacting portion, and stress acting on the boundary between the circle contacting portion and a bonding material can be distributed more extensively. Therefore, in the case of mounting the substrate on a mounting board via a bonding material, it is possible to prevent or suppress the occurrence of a crack in the bonding material due to the stress.

Application Example 2

In the substrate according to the application example of the invention, it is preferable that the first circle contacting portion and the second circle contacting portion are disposed point-symmetrically about the center of the circle.

With this configuration, the occurrence of a crack in a bonding material can be prevented more effectively.

Application Example 3

In the substrate according to the application example of the invention, it is preferable that the plurality of bonding terminals include a third bonding terminal having a third circle contacting portion and a fourth bonding terminal having a fourth circle contacting portion, that the third circle contacting portion and the fourth circle contacting portion are disposed on one side and the other side, respectively, with respect to the center of the circle, and that the circle contacting portion includes the third circle contacting portion and the fourth circle contacting portion.

With this configuration, the occurrence of a crack in a bonding material can be prevented more effectively.

Application Example 4

In the substrate according to the application example of the invention, it is preferable that the first to fourth circle contacting portions are arranged rotation-symmetrically about the center of the circle.

With this configuration, the occurrence of a crack in a bonding material can be prevented more effectively.

Application Example 5

In the substrate according to the application example of the invention, it is preferable that the one surface of the base has four corner portions, and that the first to fourth circle contacting portions are disposed at the four corner portions of the base.

With this configuration, the first bonding terminal, the second bonding terminal, the third bonding terminal, and the fourth bonding terminal can be maximally separated from each other on one surface.

Application Example 6

In the substrate according to the application example of the invention, it is preferable that at least one of the circle contacting portions has a height in the thickness direction of the base.

With this configuration, since stress is received by "plane" at the circle contacting portion, the stress can be distributed more extensively. Therefore, the occurrence of a crack in a bonding material can be prevented more effectively.

Application Example 7

In the substrate according to the application example of the invention, it is preferable that the base has a step portion which is a step relative to a recess outside the circumference of the circle and disposed at at least one portion of the circle on the circumference, and includes the circle contacting portion at at least one portion of the step portion.

With this configuration, the circle contacting portion can be simply formed.

Application Example 8

In the substrate according to the application example of the invention, it is preferable that the length of the circle contacting portion is from 1/100 to 1/50 of the length of the circumference of the circle.

With this configuration, the occurrence of a crack in a bonding material can be prevented more effectively while preventing an increase in size of the bonding terminal.

Application Example 9

In the substrate according to the application example of the invention, it is preferable that at least one of the plurality of bonding terminals having the circle contacting portion is a dummy electrode terminal which is not electrically connected with at least one of an IC chip electrically connected with a functional element and a circuit disposed in a mounting board.

With this configuration, the dummy electrode terminal distributes stress. Therefore, when the external mounting terminals and the circuit disposed in the mounting board are electrically connected, the electrical connection can be maintained reliably and stably.

Application Example 10

In the substrate according to the application example of the invention, it is preferable that the plurality of bonding terminals include an electrode terminal which is electrically connected with a circuit disposed in a mounting board, and that the electrode terminal is arranged at a location not contacting the circle on the one surface.

With this configuration, when the external mounting terminals and the circuit disposed in the mounting board are electrically connected, connection between the circuit and the electrode terminal arranged at the location not contacting the circle can also be maintained reliably and stably.

Application Example 11

In the substrate according to the application example of the invention, it is preferable that at least one of the plurality of bonding terminals having the circle contacting portion is an electrode terminal which is electrically connected with a circuit disposed in a mounting board.

With this configuration, when the external mounting terminals and the circuit disposed in the mounting board are electrically connected, connection between the electrode terminal and the circuit disposed in the mounting board can also be maintained reliably and stably because the electrode terminal has the circle contacting portion.

Application Example 12

This application example of the invention is directed to an electronic device including: the substrate according to the application example of the invention; a functional element disposed on the other surface side of the substrate; and an IC chip disposed on the other surface side of the substrate and electrically connected with the functional element.

With this configuration, an electronic device with high reliability is obtained.

Application Example 13

This application example of the invention is directed to an electronic apparatus including the substrate according to the application example of the invention.

With this configuration, an electronic apparatus with high reliability is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a substrate, an electronic device, and an electronic apparatus of the invention will be described in detail based on embodiments shown in the accompanying drawings.

1. Electronic Device

First Embodiment

First, a first embodiment of an electronic device (electronic device according to the invention) incorporating therein a substrate according to the invention will be described.

Figure 1:
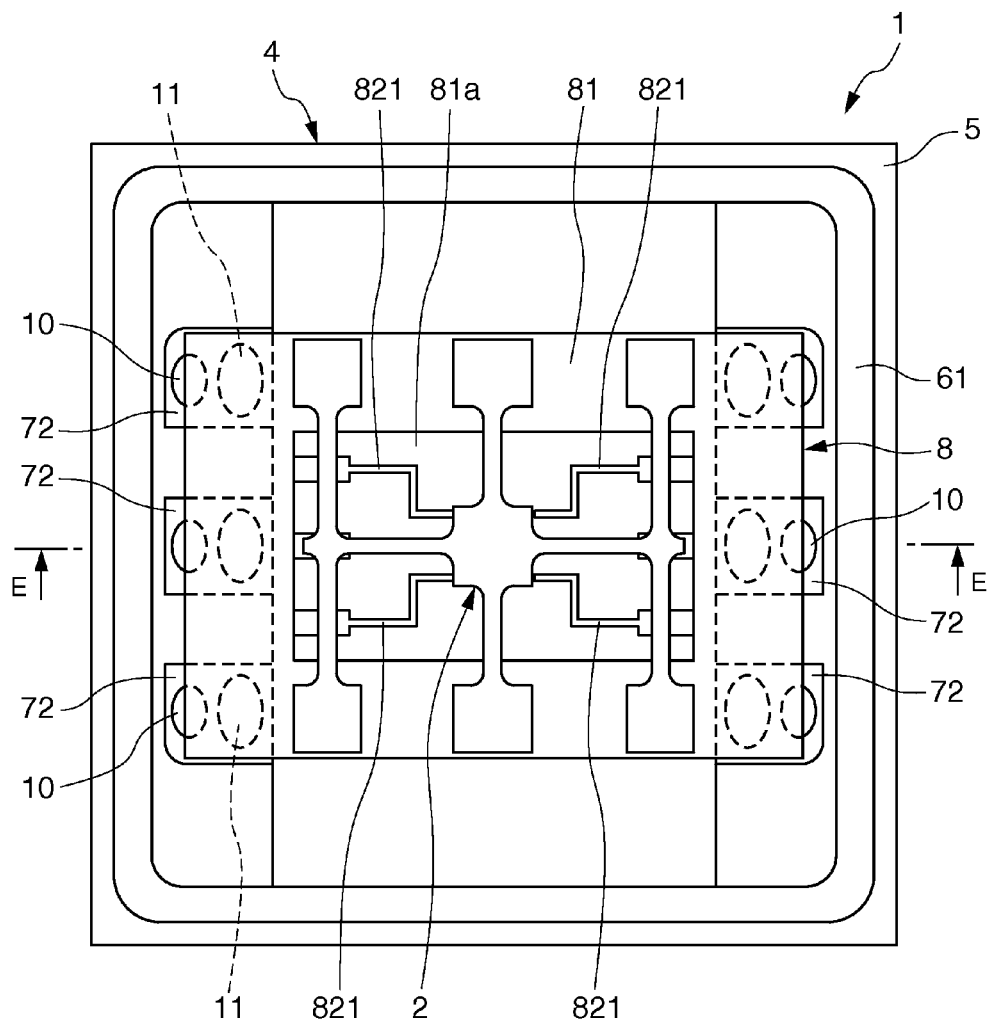
FIG. 1 is a plan view (top view) showing a first embodiment of an electronic device according the invention.
Figure 2:
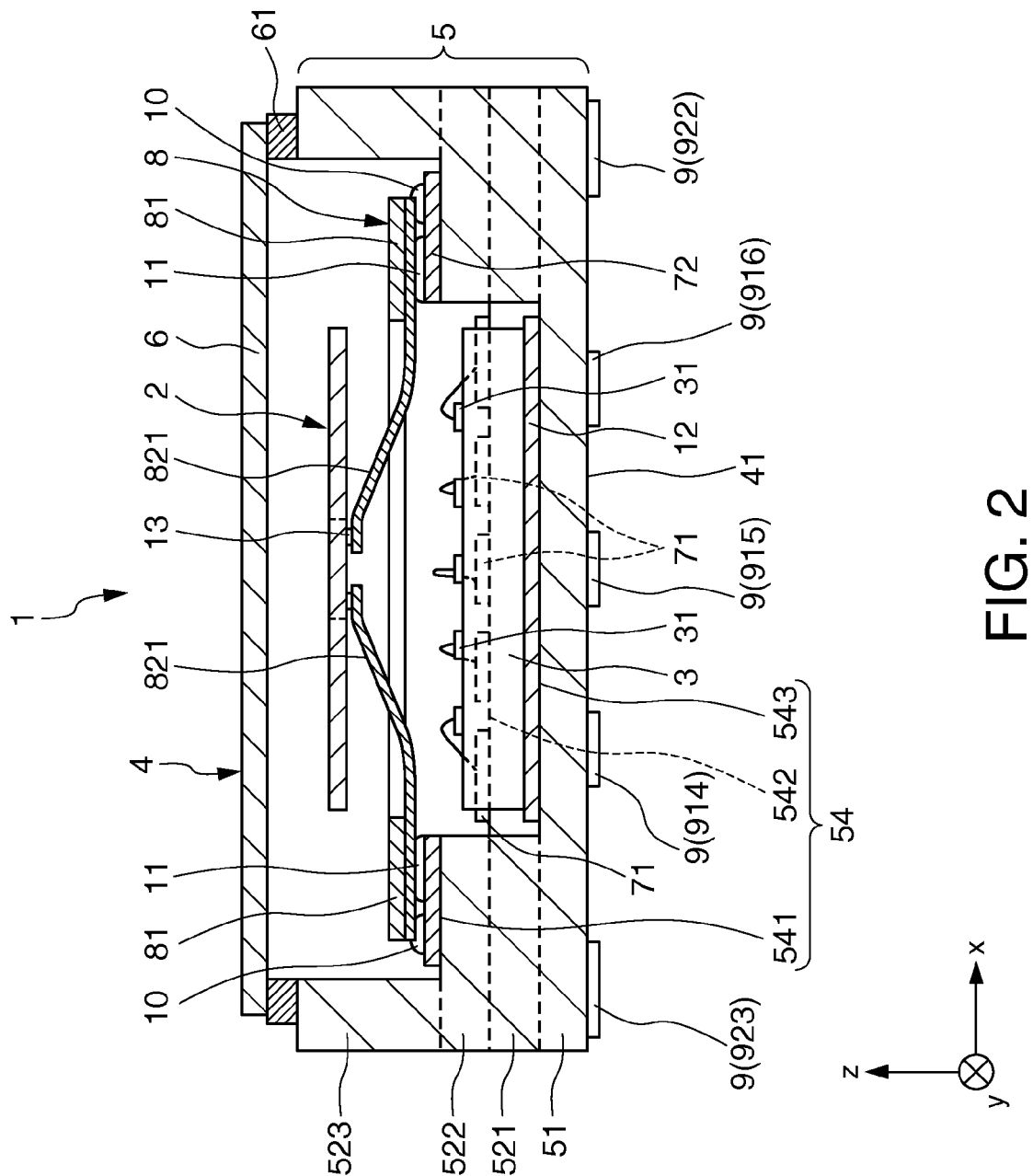
FIG. 2 is a cross-sectional view taken along line E-E of the electronic device shown in FIG. 1.
Figure 3B:
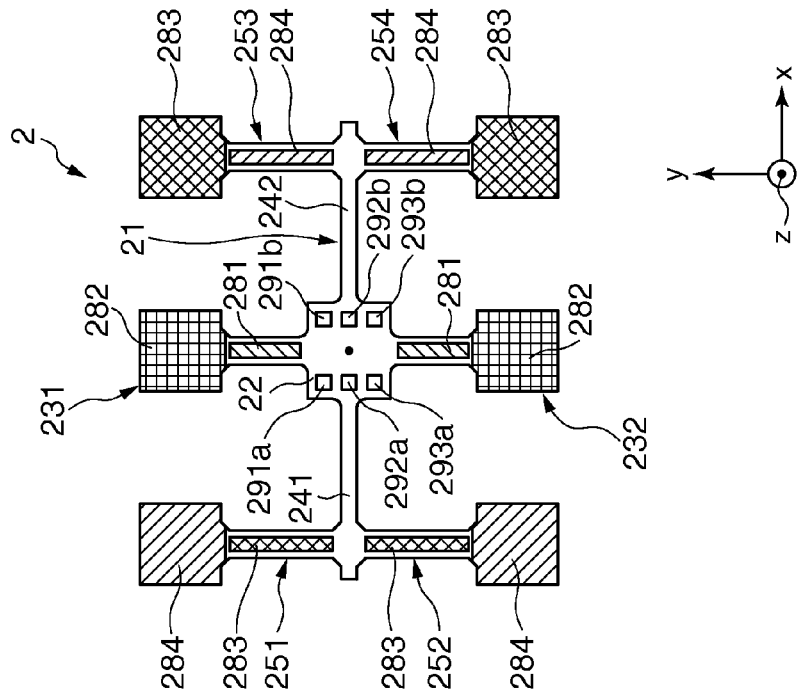
FIGS. 3A and 3B are plan views of a gyro element of the electronic device shown in FIG. 1.
Figure 3A:
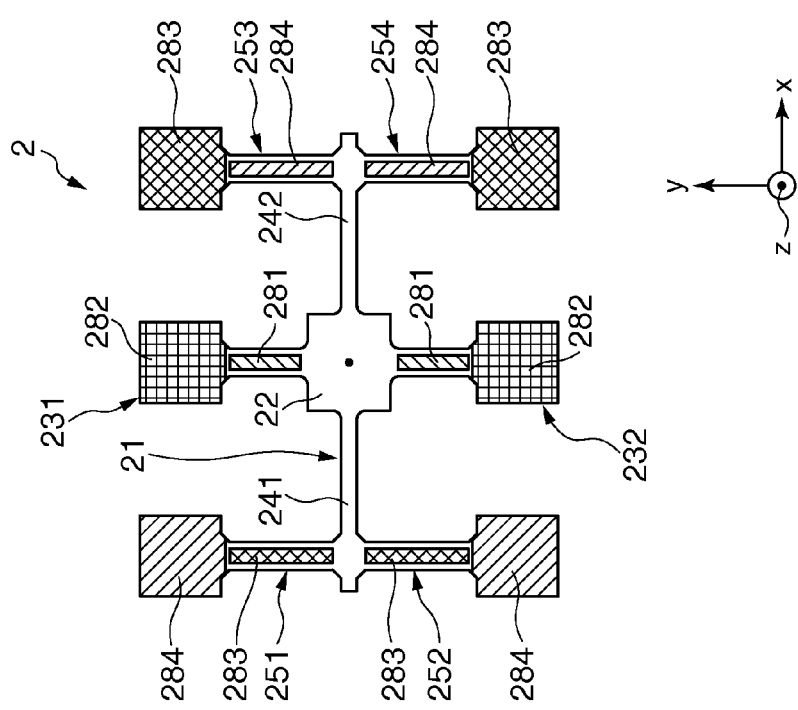
Figure 4A:
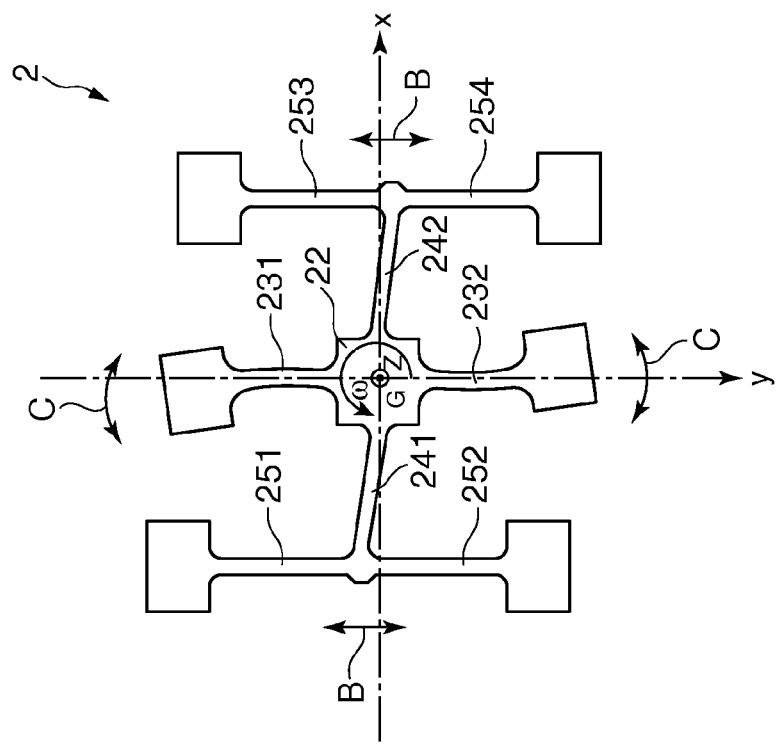
FIGS. 4A and 4B are plan views explaining the driving of the gyro element shown in FIGS. 3A and 3B.
Figure 4B:
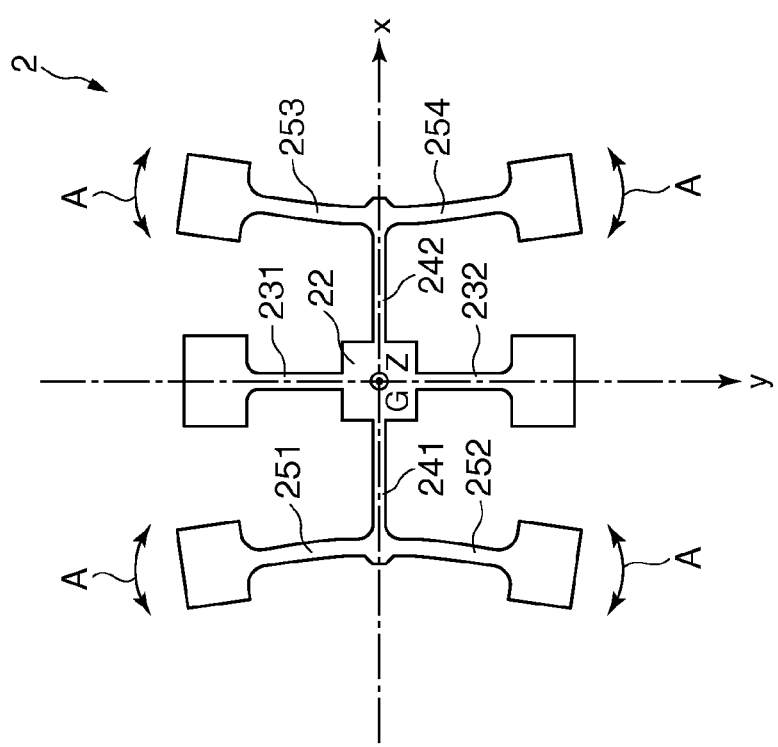
Figure 5:
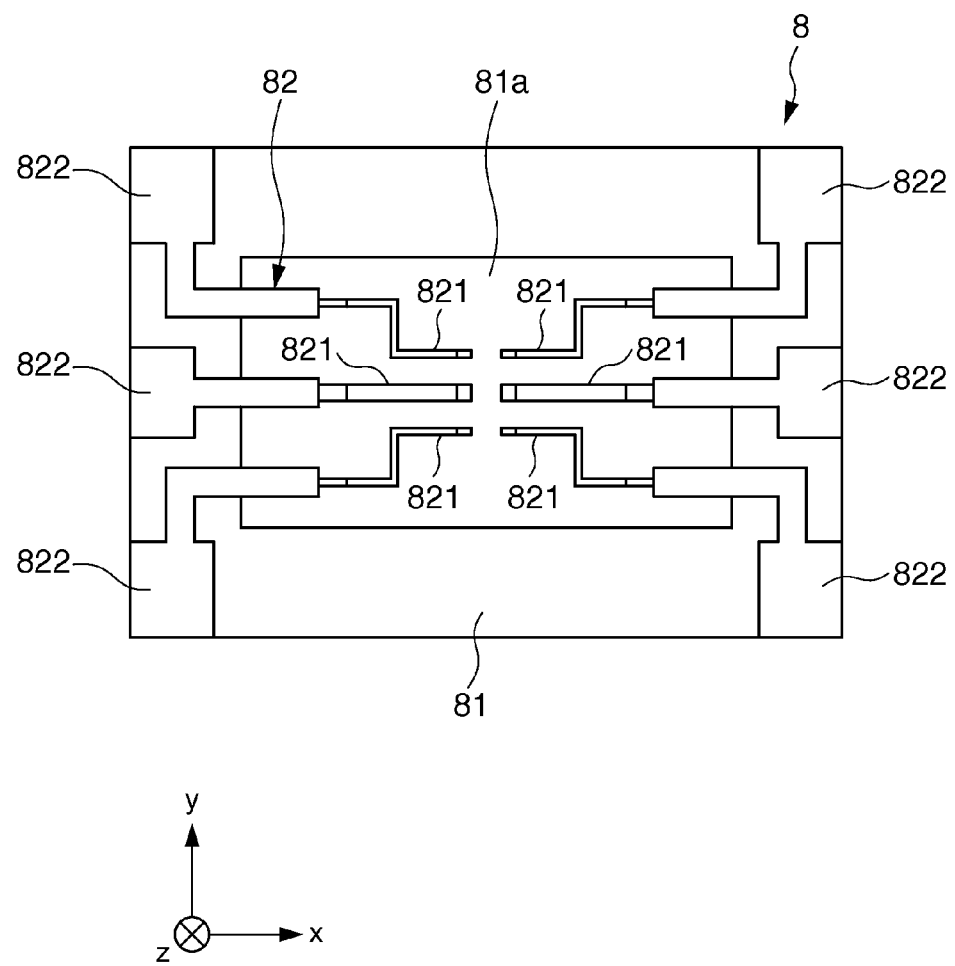
FIG. 5 is a plan view showing a supporting substrate of the electronic device shown in FIG. 1.
Figure 6:
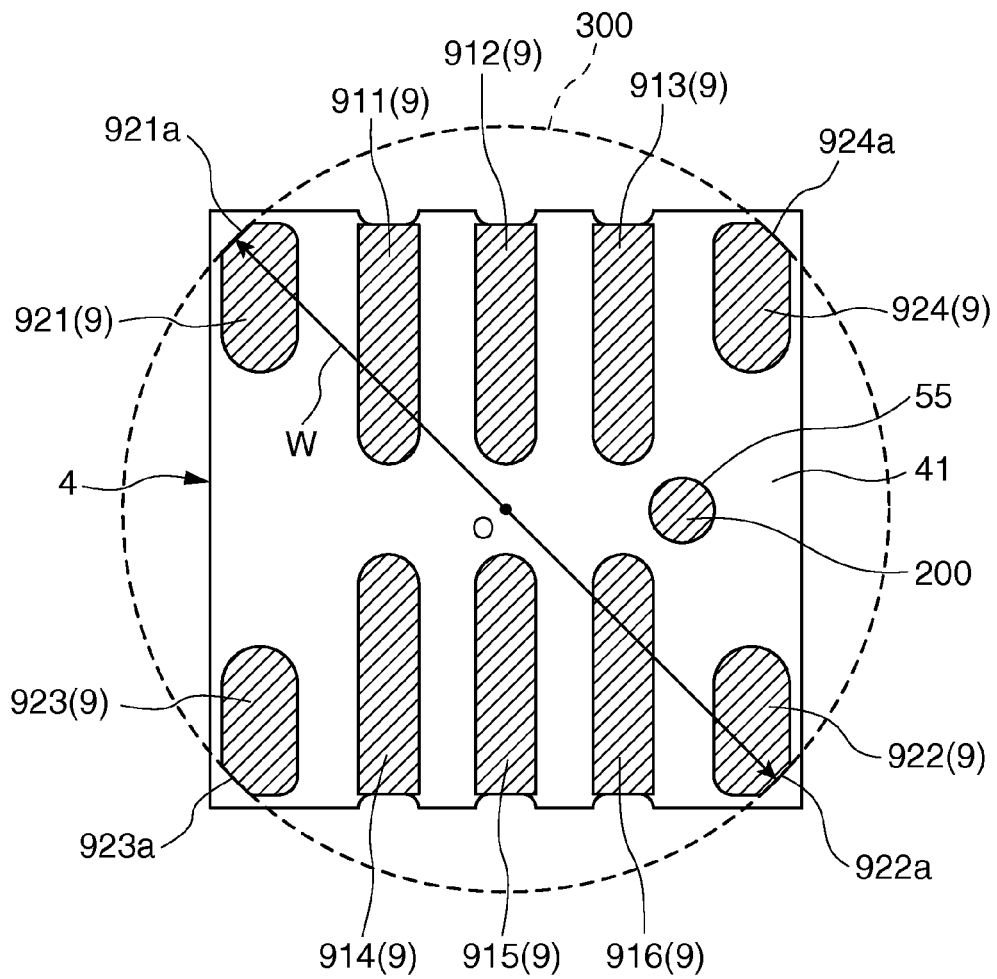
FIG. 6 is a plan view (bottom view) of the electronic device shown in FIG. 1.
Figure 7:
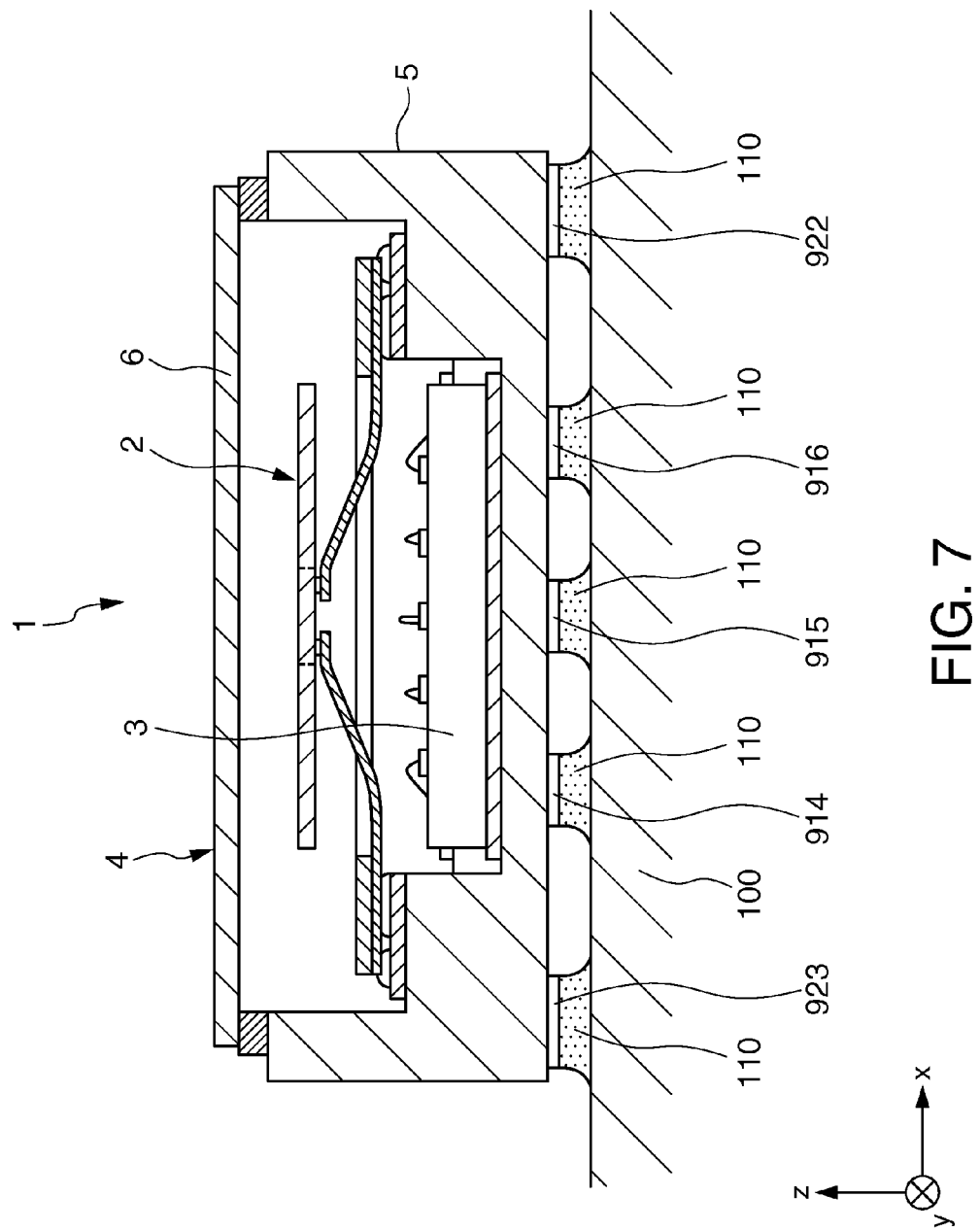
FIG. 7 is a cross-sectional view showing a state where the electronic device shown in FIG. 1 is mounted on a mounting board.

FIG. 1 is a plan view (top view) showing the first embodiment of the electronic device according to the invention. FIG. 2 is a cross-sectional view taken along line E-E of the electronic device shown in FIG. 1. FIGS. 3A and 3B are plan views of a gyro element of the electronic device shown in FIG. 1. FIGS. 4A and 4B are plan views explaining the driving of the gyro element shown in FIGS. 3A and 3B. FIG. 5 is a plan view showing a supporting substrate of the electronic device shown in FIG. 1. FIG. 6 is a plan view (bottom view) of the electronic device shown in FIG. 1. FIG. 7 is a cross-sectional view showing a state where the electronic device shown in FIG. 1 is mounted on a mounting board. In the following, the front side of the sheet in FIG. 1 is referred to as "upper", the back side of the sheet is referred to as "lower", the left side is referred to as "left", and the right side is referred to as "right", for convenience of description. Moreover, as shown in FIG. 1, three axes perpendicular to each other are referred to as x-axis, y-axis, and z-axis. The z-axis coincides with the thickness direction of the electronic device. Moreover, a direction parallel to the x-axis is referred to as "x-axis direction", a direction parallel to the y-axis is referred to as "y-axis direction", and a direction parallel to the z-axis is referred to as "z-axis direction". In FIG. 1, illustration of a lid 6 is omitted.

As shown in FIGS. 1 and 2, the electronic device 1 has a functional element 2, an IC chip 3 which performs the driving or the like of the functional element 2, and a package 4 (package incorporating therein the substrate according to the invention) which accommodates the functional element 2 and the IC chip 3.

Examples of the functional element 2 are not particularly limited, and include, for example, elements such as an angular velocity detecting element, an acceleration detecting element, and an oscillating element. In the following, a configuration using an angular velocity detecting element (hereinafter referred to as "gyro element 2") as the functional element 2 will be described as a representative, for convenience of description.

The electronic device 1 can be suitably used as a gyro sensor device.

Gyro Element 2

Hereinafter, the gyro element 2 will be described based on FIGS. 3A and 3B and FIGS. 4A and 4B. FIG. 3A is a plan view of an upper surface seen from above (the lid 6 side). FIG. 3B is a plan view (perspective view) of a lower surface seen from above.

The gyro element 2 is a so-called "in-plane detection-type" sensor which detects an angular velocity about the z-axis, and has a vibrating reed 21 of a double-T-type. The vibrating reed 21 can be composed of a piezoelectric material such as quartz crystal, lithium tantalate, or lithium niobate. However, quartz crystal is preferable among them. With this configuration, excellent temperature characteristics and frequency characteristics can be provided.

The vibrating reed 21 extends in the xy plane and has a thickness in the z-axis direction. The vibrating reed 21 has a base portion 22 located at the center, a pair of detecting vibration arms 231 and 232 each extending outwardly from the base portion 22 in the y-axis direction, a pair of coupling arms 241 and 242 each extending outwardly from the base portion 22 in the x-axis direction, a pair of driving vibration arms 251 and 252 each extending outwardly from a tip portion of the coupling arm. 241 in the y-axis direction, and a pair of driving vibration arms 253 and 254 each extending outwardly from a tip portion of the coupling arm 242 in the y-axis direction.

Moreover, at a tip portion of each of the detecting vibration arms 231 and 232 and the driving vibration arms 251 to 254, a weight portion which is substantially quadrilateral and has a width greater than that thereof on its base-end side is formed. By disposing the weight portion, detection sensitivity of the gyro element 2 for angular velocity is improved.

On surfaces of the vibrating reed 21, various kinds of electrodes, terminals, and the like are formed.

Specifically, a detecting signal electrode 281 is formed on upper and lower surfaces of the detecting vibration arm 231. A detecting signal electrode 281 is formed also on upper and lower surfaces of the detecting vibration arm 232.

The pair of detecting signal electrodes 281 formed on the detecting vibration arm 231 are electrically connected, via wirings (not shown) formed on the surfaces of the vibrating reed 21, to a detecting signal terminal 291$a$ formed in the base portion 22. The pair of detecting signal electrodes 281 formed on the detecting vibration arm 232 are electrically connected, via wirings (not shown) formed on the surfaces of the vibrating reed 21, to a detecting signal terminal 291$b$ formed in the base portion 22.

Moreover, a detecting ground electrode 282 is formed on side surfaces of the detecting vibration arm 231 and upper and lower surfaces of the weight portion of the detecting vibration arm 231. A detecting ground electrode 282 is formed also on side surfaces of the detecting vibration arm 232 and upper and lower surfaces of the weight portion of the detecting vibration arm 232.

The pair of detecting ground electrodes 282 formed on the detecting vibration arm 231 are electrically connected, via wirings (not shown) formed on the surfaces of the vibrating reed 21, to a detecting ground terminal 292$a$ formed in the base portion 22. The pair of detecting ground electrodes 282 formed on the detecting vibration arm 232 are electrically connected, via wirings (not shown) formed on the surfaces of the vibrating reed 21, to a detecting ground terminal 292$b$ formed in the base portion 22. The detecting ground electrode 282 has a potential serving as a ground with respect to the detecting signal electrode 281.

Moreover, a driving signal electrode 283 is formed on upper and lower surfaces of the driving vibration arm 251. A driving signal electrode 283 is formed also on upper and lower surfaces of the driving vibration arm 252. Moreover, a driving signal electrode 283 is formed also on side surfaces of the driving vibration arm 253 and upper and lower surfaces of the weight portion of the driving vibration arm 253. A driving signal electrode 283 is formed also on side surfaces of the driving vibration arm 254 and upper and lower surfaces of the weight portion of the driving vibration arm 254. The plurality of driving signal electrodes 283 are electrically connected, via wirings (not shown) formed on the surfaces of the vibrating reed 21, to a driving signal terminal 293$a$ formed in the base portion 22.

Moreover, a driving ground electrode 284 is formed on side surfaces of the driving vibration arm 251 and upper and lower surfaces of the weight portion of the driving vibration arm 251. A driving ground electrode 284 is formed also on side surfaces of the driving vibration arm 252 and upper and lower surfaces of the weight portion of the driving vibration arm 252. Moreover, a driving ground electrode 284 is formed also on upper and lower surfaces of the driving vibration arm 253. A driving ground electrode 284 is formed also on upper and lower surfaces of the driving vibration arm 254. The plurality of driving ground electrodes 284 are electrically connected, via wirings (not shown) formed on the surfaces of the vibrating reed 21, to a driving ground terminal 293$b$ formed in the base portion 22. The driving ground electrode 284 has a potential serving as a ground with respect to the driving signal electrode 283.

The gyro element 2 having the configuration described above detects an angular velocity $\omega$ about the z-axis as follows. In the gyro element 2, when an electric field is generated between the driving signal electrode 283 and the driving ground electrode 284 in a state where the angular velocity $\omega$ is not applied, the driving vibration arms 251, 252, 253, and 254 perform bending vibration in directions shown by double-headed arrows A as shown in FIG. 4A. In this case, since the driving vibration arms 251 and 252 and the driving vibration arms 253 and 254 vibrate plane-symmetrically with respect to the yz plane passing through a central point G, the base portion 22, the coupling arms 241 and 242, and the detecting vibration arms 231 and 232 hardly vibrate.

When the angular velocity ω about the z-axis is applied to the gyro element 2 in a state of performing this driving vibration, the gyro element 2 vibrates as shown in FIG. 4B. That is, the Coriolis force in directions of double-headed arrows B acts on the driving vibration arms 251, 252, 253, and 254 and the coupling arms 241 and 242, and in response to vibration in the directions of the double-headed arrows B, detecting vibration in directions of double-headed arrows C is excited. Then, the strain of the detecting vibration arms 231 and 232 caused by this vibration is detected by the detecting signal electrode 281 and the detecting ground electrode 282 to obtain the angular velocity ω.

IC Chip 3

The IC chip 3 is an electronic device formed by integrating a driving circuit which drives the gyro element 2, a detector circuit including a charge amplifier, and the like. That is, the IC chip 3 is an electronic device which outputs an electric signal to the driving signal electrode 283 of the gyro element 2, and receives and processes an electric signal from the detecting signal electrode 281 to obtain the angular velocity ω about the z-axis.

Package 4

As shown in FIG. 2, the package 4 has a package base 5 in which a recess 54 opened in an upper surface of the package base is formed and the lid 6 bonded to the package base 5 so as to cover the opening of the recess 54.

The recess 54 formed in the package base 5 has a first recess 541, a second recess 542, and a third recess 543. The first recess 541 is opened in the upper surface of the package base 5. The second recess 542 is opened in the central portion excepting both end portions of the first recess 541 in the x-axis direction and has a cross-sectional area smaller than that of the first recess 541. The third recess 543 is opened in the central portion excepting both end portions of the second recess 542 in the y-axis direction and has a cross-sectional area smaller than that of the second recess 542.

That is, the package base 5 has a plate-like base 51, a frame-like first side wall 521, a frame-like second side wall 522, and a frame-like third side wall 523. The base 51 constitutes a bottom portion. The first side wall 521 is disposed on an upper surface of the base 51 and has in the inside of the first side wall a space corresponding to a cross-sectional shape of the third recess 543. The second side wall 522 is disposed on an upper surface of the first side wall 521 and has in the inside of the second side wall a space corresponding to a cross-sectional shape of the second recess 542. The third side wall 523 is disposed on an upper surface of the second side wall 522 and has in the inside of the third side wall a space corresponding to a cross-sectional shape of the first recess 541.

Moreover, a sealing hole 55 which communicates between the interior and exterior of the package 4 is formed in the package base 5. The sealing hole 55 is a hole for causing the interior of the package 4 to be a reduced-pressure environment (preferably a vacuum). By causing the interior of the package to be a reduced-pressure environment, vibration characteristics of the gyro element 2 are improved. The sealing hole 55 is sealed by a sealing material 200 composed of a metal material after removing air within the package 4.

The constituent material of the package base 5 is not particularly limited, and various kinds of ceramics such as aluminum oxide can be used. When the package base 5 is manufactured from the constituent material described above, the package base 5 can be simply manufactured by forming a laminated body by laminating a plurality of flat plate-like substrates and baking the laminated body.

The lid 6 has a plate shape and covers the opening of the recess 54 to be bonded to the package base 5. The constituent material of the lid 6 is not particularly limited. However, it is desirable that the constituent material is a member having a coefficient of linear expansion close to that of the constituent material of the package base 5. For example, when ceramics is used as the constituent material of the package base 5 as described above, an alloy such as Kovar is preferably used. The lid 6 is, for example, seam-welded to the package base 5 via a seam ring 61.

A die pad 12 is formed on a bottom surface of the third recess 543 of the package 4, and the IC chip 3 is die-attached to the die pad 12. Moreover, as shown in FIG. 2, a plurality of IC pads 31 are formed on an upper surface of the IC chip 3. Each of the IC pads 31 is electrically connected via a metal wire to a bonding pad 71 formed on a bottom surface of the second recess 542.

A supporting substrate 8 is fixedly bonded to a bottom surface of the first recess 541 via epoxy-based conductive adhesive 10 and silicone-based conductive adhesive 11. For the supporting substrate 8, a substrate for TAB mounting is used.

As shown in FIG. 5, the supporting substrate 8 has a plate frame-like base portion 81 having an opening 81a in the inside thereof and a conductor pattern 82 formed on a lower surface of the base portion 81. The conductor pattern 82 has six leads 821. A portion of each of the leads 821 is bent, and a tip thereof passes through the opening 81a to be located higher than the base portion 81.

At the tips of the leads 821, the gyro element 2 is supported in the air via conductive adhesive 13 so as not to contact the others. In this state, the six leads 821 and the six terminals 291a, 291b, 292a, 292b, 293a, and 293b formed in the gyro element 2 are electrically connected in one-to-one relation via the conductive adhesive 13.

The conductor pattern 82 has six connection pads 822 formed at edges of the base portion 81. The six connection pads 822 and the six leads 821 are electrically connected in one-to-one relation.

On the other hand, six bonding pads 72 corresponding to the six connection pads 822 are formed on the bottom surface of the first recess 541 of the package base 5. The bonding pads 72 and the connection pads 822 are electrically connected in one-to-one relation via the epoxy-based conductive adhesive 10 and the silicone-based conductive adhesive 11.

The epoxy-based conductive adhesive 10 is arranged on an outer circumferential side of the supporting substrate 8, and the silicone-based conductive adhesive 11 is arranged on a side closer to the opening 81a of the supporting substrate 8. Therefore, electrical continuity can be reliably established between the connection pad 822 and the bonding pad 72 with the epoxy-based conductive adhesive 10, and resonance of the leads 821 in driving vibration of the gyro element 2 can be absorbed by the silicone-based conductive adhesive 11.

As shown in FIG. 6, a plurality of external mounting terminals 9 are formed on a rear surface 41 (lower surface of the base 51) of the package 4. Then, as shown in FIG. 7, the electronic device 1 is mounted on a mounting board 100 with the external mounting terminals 9 via solder (bonding material) 110.

Examples of the mounting board 100 are not particularly limited, and include, for example, a printed wiring board in which a circuit is formed. The bonding material is not limited to the solder 110, and a conductive bonding material such as, for example, a conductive adhesive material or a conductive bump may be used. When electrical continuity does not need to be established with a bonding material, epoxy-based, acrylic-based, or silicone-based insulating adhesive, for example, may be used.

A substrate according to the invention is composed of at least the base 51 and the plurality of external mounting terminals 9 formed on the lower surface of the base 51. The shape of the base 51 is not necessarily a plate-like shape. For example, an upper surface of the base 51 may have a recessed shape, so that the base 51 may be a package having a recess.

As shown in FIG. 6, the plurality of external mounting terminals 9 include six main electrode terminals (electrode terminals) 911, 912, 913, 914, 915, and 916 associated with electrical connection and four sub-electrode terminals (dummy electrode terminals) 921, 922, 923, and 924 not associated with electrical connection.

The main electrode terminals 911 to 916 are electrically connected, via conductive posts or the like (not shown) formed in the package base 5, to any of the bonding pads 71 and 72. In a state where the electronic device 1 is mounted on the mounting board 100, each of the main electrode terminals 911 to 916 is electrically connected to a circuit formed in the mounting board 100 via the solder 110, whereby the circuit of the mounting board 100 and the IC chip 3 and the gyro element 2 within the package 4 are electrically connected. At least one of the main electrode terminals 911 to 916 may function as, for example, a ground electrode for stabilizing a reference potential of the package 4.

Moreover, the main electrode terminals 911 to 916 are formed concentratedly at the central portion of the rear surface 41 in the x-axis direction and each extend in the y-axis direction. With this configuration, a space for forming each of the sub-electrode terminals 921 to 924 can be sufficiently assured at each corner portion of the rear surface 41.

It is preferable that the main electrode terminals 911 to 916 are formed so as to turn from the rear surface 41 of the package 4 to its side surfaces. In this manner, the main electrode terminals 911 to 916 are extended to the side surfaces of the package 4, whereby a contact area between the main electrode terminals 911 to 916 and the solder 110 is increased to enhance the bonding strength between the package 4 and the mounting board 100. Moreover, since the solder 110 spreads by wetting over the side-surface portions of the main electrode terminals 911 to 916, the solder 110 protrudes from the outer circumference of the package 4. Therefore, a state of bonding between the main electrode terminals 911 to 916 and the solder 110, and the like can be simply seen, so that productivity or yield is improved.

The total area of the main electrode terminals 911 to 916 is included in a circle 300 which will be described later.

The sub-electrode terminals 921 to 924 are terminals not associated with electrical connection between the circuit formed in the mounting board 100 and the IC chip 3 and the gyro element 2. The sub-electrode terminals 921 to 924 are terminals for, for example, enhancing the bonding strength between the package 4 and the mounting board 100 and for performing the positioning of the package 4 relative to the mounting board 100.

At least one of the sub-electrode terminals 921 to 924 is electrically connected with the gyro element 2 or the IC chip 3. However, the sub-electrode terminals 921 to 924 may have a mode where they are not electrically connected with the circuit formed in the mounting board 100. For example, although electrical connection with the circuit formed in the mounting board 100 is not needed, an electrode terminal to be used in inspection for the electronic device 1 or the like can be used as the sub-electrode terminals 921 to 924.

Moreover, the sub-electrode terminals 921 to 924 are separately disposed at four corner portions of the rear surface 41. With this configuration, the sub-electrode terminals 921 to 924 can be maximally separated from each other, so that the above-described functions as the sub-electrode terminal can be effectively provided. That is, the bonding strength between the package 4 and the mounting board 100 against stress F can be further enhanced, and further the positioning of the package 4 relative to the mounting board 100 can be performed with higher accuracy. Moreover, when the shape of the rear surface 41 is a hexagon for example, a sub-electrode can be disposed at six corner portions. It is possible to appropriately dispose a sub-electrode.

The "corner portion" includes a rounded one and a partially lost one.

In the electronic device 1 as shown in FIG. 6, when defining, in the xy-plane view, the circle 300 circumscribing the sub-electrode terminal (first bonding terminal) 921 and the sub-electrode terminal (second bonding terminal) 922 between which a separate width W (that is, a maximum length of a line obtained by connecting, when any one pair of terminals are selected from all of the external mounting terminals 9, a point on the outline of the selected one terminal with a point on the outline of the other terminal) is the greatest, the external mounting terminals 9 are formed such that the total area of all of the external mounting terminals 9 is included or inscribed in the circle 300. Moreover, a circle contacting portion (first circle contacting portion) 921a which is a portion of the outline of the sub-electrode terminal 921 and contacts the circle 300 and a circle contacting portion (second circle contacting portion) 922a which is a portion of the outline of the sub-electrode terminal 922 and contacts the circle 300 each extend along the circumference of the circle 300 and face each other via the center O of the circle 300.

Moreover, in the embodiment, the sub-electrode terminal (third bonding terminal) 923 and the sub-electrode terminal (fourth bonding terminal) 924 have respectively circle contacting portions (third circle contacting portion and fourth circle contacting portion) 923a and 924a each of which is a portion of the outline and contacts the circle 300. The circle contacting portions 923a and 924a each extend along the circumference of the circle 300 and face each other via the center O.

With the configuration described above, the breakage of the solder 110, that is, the occurrence of a solder crack can be prevented or suppressed. Specifically, when the mounting board 100 is composed of a glass epoxy board and the package base 5 is composed of alumina for example, the coefficients of thermal expansion of these materials are different from each other. Therefore, in a state where the electronic device 1 is mounted on the mounting board 100 (the state shown in FIG. 7), the stress (thermal shock) F acts, with temperature rising (change in temperature), on the interface between the solder 110 and the external mounting terminals 9.

The stress F acts particularly on portions whose distance from the center O is the greatest in the interface, that is, the circle contacting portions 921a, 922a, 923a, and 924a located on the circumference of the circle 300. This is because as the distance from the center O increases, the difference in deformation amount (expansion amount) between the mounting board 100 and the package base 5 increases. In this manner, since the greater stress F is applied to the boundary between each of the circle contacting portions 921a to 924a and the solder 110, a solder crack beginning at the portion is likely to occur.

Therefore, in the electronic device 1, the circle contacting portions 921a to 924a are each formed to be an arc extended along the circumference of the circle 300, and the stress F is received by "line" at each of the circle contacting portions 921a to 924a to distribute the stress F, thereby localized concentration of the stress F is prevented or suppressed. With this configuration, it is possible to effectively prevent or suppress the occurrence of a solder crack beginning at the boundary between each of the circle contacting portions 921a to 924a and the solder 110.

With the configuration described above, since the stress F is received at the circle contacting portions 921a to 924a, the occurrence of a solder crack in the main electrode terminals (electrode terminals) 911, 912, 913, 914, 915, and 916 located in the circle 300 can be prevented.

In the embodiment, the circle contacting portions 921a and 922a are formed point-symmetrically about the center O. Therefore, the stress F applied between the circle contacting portions 921a and 922a can be received in good balance and effectively at the circle contacting portions 921a and 922a, so that the occurrence of a solder crack can be more effectively prevented. Also the circle contacting portions 923a and 924a are formed point-symmetrically about the center O, so that the effect similar to that described above can be provided.

Moreover, in the embodiment, the stress F is received at the two pairs of circle contacting portions, four in total, the pair of circle contacting portions 921a and 922a arranged to face each other via the center O and the pair of circle contacting portions 923a and 924a arranged to face each other via the center O in a direction different from a separate direction of the circle contacting portions 921a and 922a. Therefore, the stress F can be efficiently received, so that the occurrence of a solder crack can be more effectively prevented.

Moreover, the circle contacting portions 921a to 924a are formed rotation-symmetrically about the center O. Therefore, the stress F can be received in good balance at the circle contacting portions 921a to 924a, so that the occurrence of a solder crack can be more effectively prevented. Particularly, the separate direction of the circle contacting portions 921a and 922a and the separate direction of the circle contacting portions 923a and 924a are substantially perpendicular to each other. Therefore, the stress F can be received in better balance at the circle contacting portions 921a to 924a, so that the above-described effect can be provided more effectively.

The length of the circle contacting portions 921a to 924a is not particularly limited, and preferably from about $1/100$ to $1/50$ of the length of the circumference of the circle 300, for example. With the length described above, the above-described effect can be sufficiently provided while preventing an increase in size of the sub-electrode terminals 921 to 924.

The configuration of the electronic device 1 has been described in detail so far. According to the electronic device 1, in a state of being mounted on the mounting board 100 via the solder 110, the occurrence of a solder crack (breakage of the solder 110) can be prevented or suppressed even when the stress F generated by temperature rising or the like is applied, so that strong mounting (bonding) to the mounting board 100 can be maintained. Therefore, the reliability of the electronic device 1 is improved. As the size of the package 4 (size of the rear surface) increases, the electronic device 1 can remarkably provide the above-described effect.

Moreover, in the electronic device 1, the sub-electrode terminals 921 to 924 not associated with electrical connection have the circle contacting portions 921a to 924a, and the main electrode terminals 911 to 916 associated with electrical connection are located in the inside of the circle 300 without contacting the circumference thereof. Therefore, the stress F acting on the boundary between each of the main electrode terminals 911 to 916 and the solder 110 is smaller than the stress F acting on the boundary between each of the circle contacting portions 921a to 924a and the solder 110, so that it is possible to effectively prevent the occurrence of a solder crack beginning at the boundary between each of the main electrode terminals 911 to 916 and the solder 110. Accordingly, a state where the main electrode terminals 911 to 916 and the circuit formed in the mounting board 100 are electrically connected can be maintained more reliably and stably, so that the reliability of the electronic device 1 is improved.

As shown in FIG. 6, the sealing hole 55 is formed at a location shifted from the center O of the rear surface 41. However, the sealing hole 55 may be formed so as to overlap with the center O. Since the location overlapping with the center O is a place to which the stress F described above is hardly applied, a state of being sealed with the sealing material 200 can be maintained more reliably.

Second Embodiment

Next, a second embodiment of an electronic device of the invention will be described.

Figure 8:
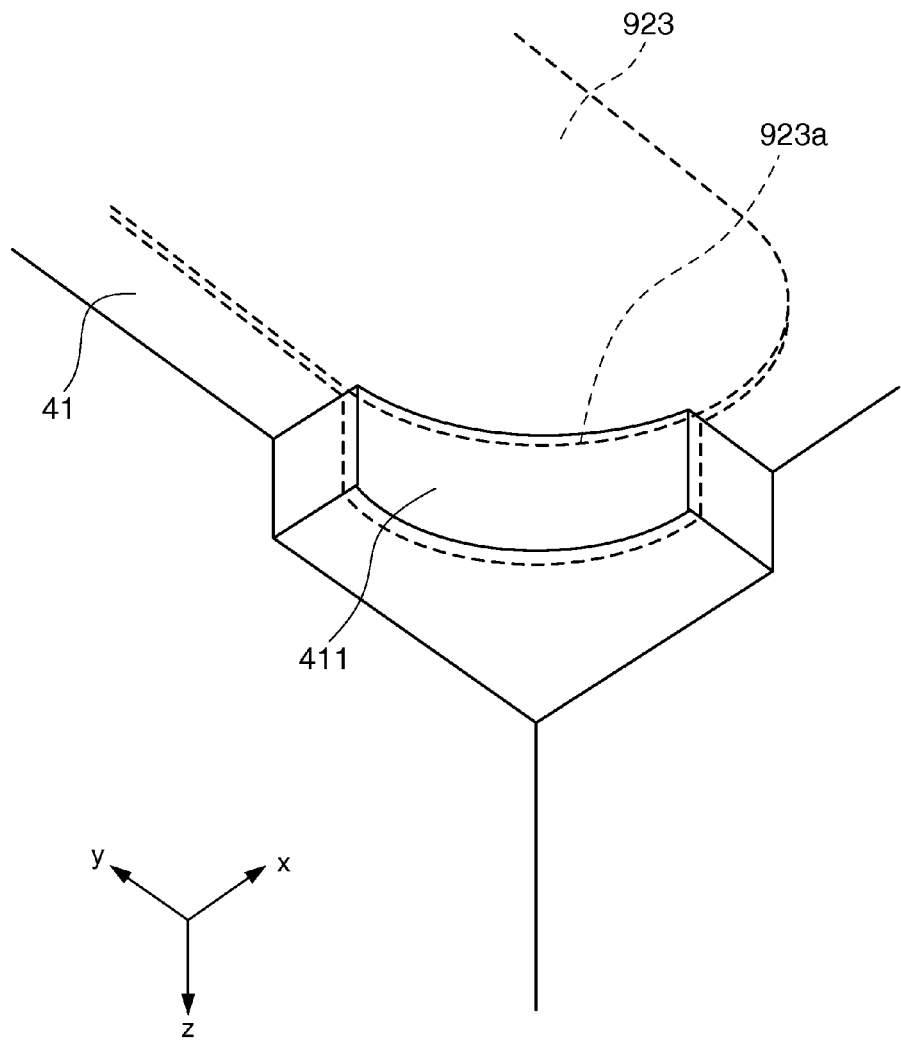
FIG. 8 is a perspective view of an electronic device according to a second embodiment of the invention.
Figure 9:
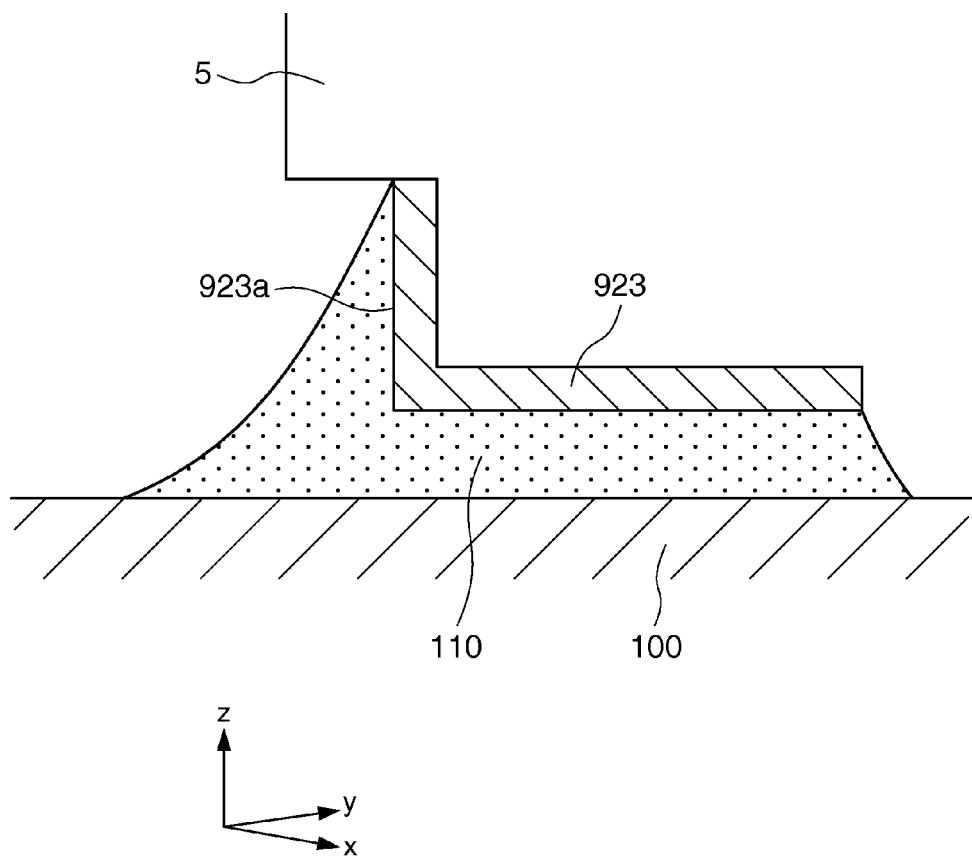
FIG. 9 is a cross-sectional view of the electronic device shown in FIG. 8.

FIG. 8 is a perspective view of the electronic device according to the second embodiment of the invention. FIG. 9 is a cross-sectional view of the electronic device shown in FIG. 8.

Hereinafter, the electronic device of the second embodiment will be described mainly on the difference from the above-described embodiment. Descriptions of matters similar to those of the above-described embodiment are omitted.

The electronic device according to the second embodiment of the invention is similar to that of the above-described first embodiment, excepting that the configuration of the circle contacting portion of the sub-electrode terminal is different. Configurations similar to those of the above-described first embodiment are denoted by the same reference and numeral signs.

In the embodiment, the configurations of the sub-electrode terminals 921 to 924 are similar to each other. Therefore, in the following, the sub-electrode terminal 923 will be described as a representative, and descriptions of the other sub-electrode terminals 921, 922, and 924 are omitted.

As shown in FIG. 8, a step portion 411 is formed at a portion of the rear surface 41 of the package 4 of the electronic device 1 of the embodiment, the portion corresponding to the circle contacting portion 923a. At the step portion 411, a surface closer to the edge side than the step portion is recessed more than a surface on the center side, and located on the upper side (the other surface side). Then, the sub-electrode terminal 923 is formed so as to cover the step portion 411, whereby adhesion with a bonding material at the step portion 411 can be stably obtained. With this configuration, the circle contacting portion 923a has a height in the z-axis direction. The height of the circle contacting portion 923a is not particularly limited, and preferably from about 0.1 to 2 mm, for example.

In this manner, the circle contacting portions 921a to 924a each have a height in the z-axis direction, whereby the electronic device is mounted on the mounting board 100 in the state shown in FIG. 9. Therefore, the stress F can be received by "plane" at the circle contacting portions 921a to 924a to distribute the stress F, thereby preventing or suppressing localized concentration of the stress F. With this configuration, it is possible to effectively prevent or suppress the occurrence of a solder crack beginning at the boundary between each of the circle contacting portions 921a to 924a and the solder 110.

In this manner, since the stress F is received by "plane" at the circle contacting portions 921a to 924a in the embodiment, the stress F can be more extensively distributed compared to the above-described first embodiment in which the stress F is received by "line". Therefore, the occurrence of a solder crack can be more effectively prevented or suppressed compared to the first embodiment.

Moreover, by forming the step portion 411 on the rear surface 41, the circle contacting portions 921a to 924a having a height can be formed without thickening the sub-electrode terminals 921 to 924. Therefore, the circle contacting portions 921a to 924a having a height can be simply formed while preventing a reduction in strength of the sub-electrode terminals 921 to 924 or an increase in size of the electronic device 1 due to the increased thickness.

Also in the second embodiment, effects similar to those of the above-described first embodiment can be provided.

Third Embodiment

Next, a third embodiment of an electronic device of the invention will be described.

Figure 10:
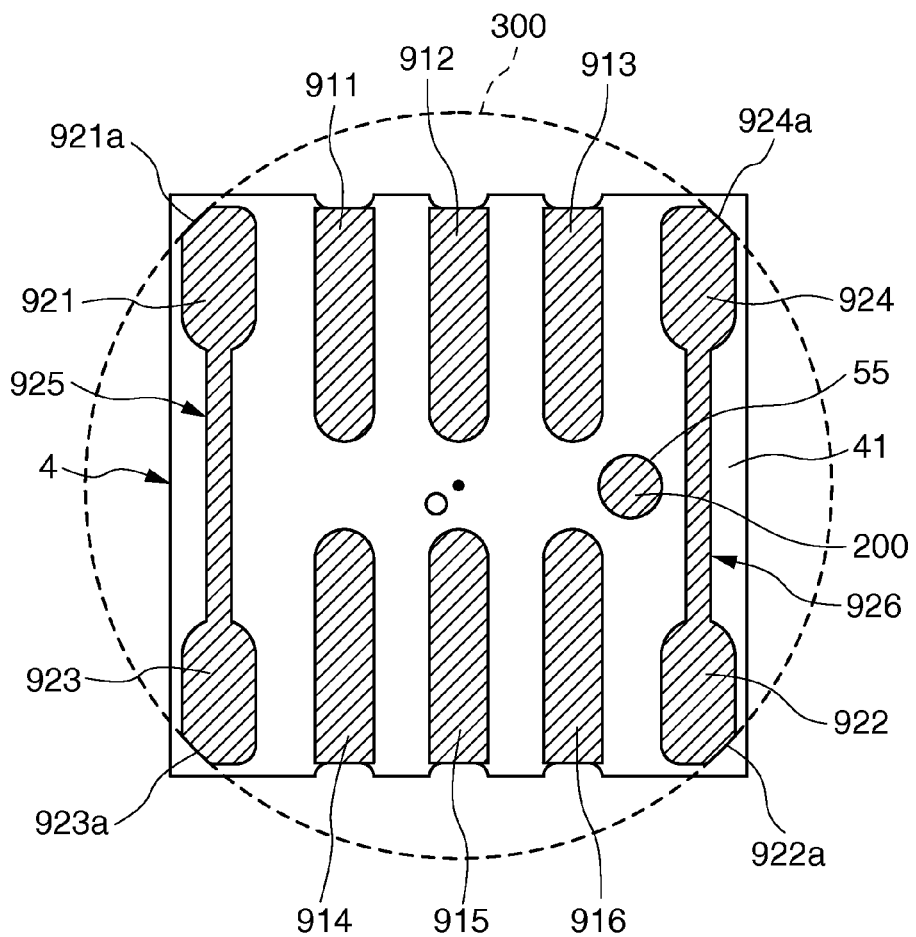
FIG. 10 is a plan view (bottom view) of an electronic device according to a third embodiment of the invention.
Figure 11:
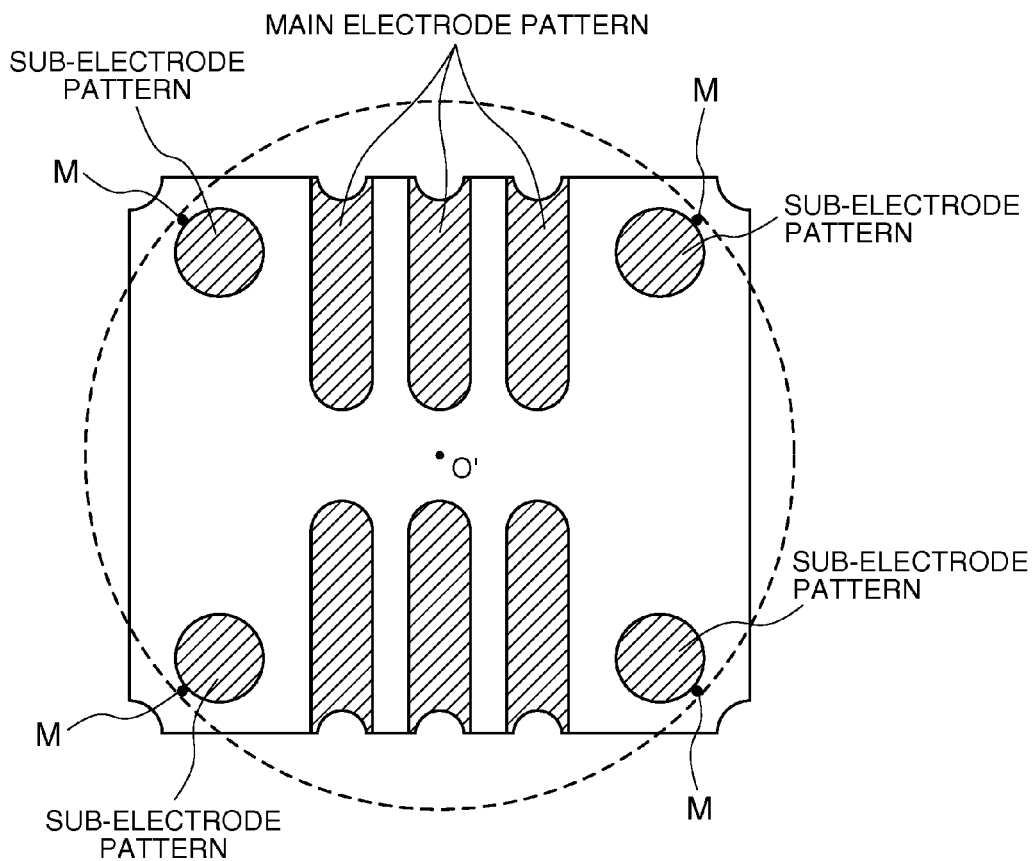
FIG. 11 is a plan view (bottom view) showing a related art.

FIG. 10 is a plan view (bottom view) of the electronic device according to the third embodiment of the invention.

Hereinafter, the electronic device of the third embodiment will be described mainly on the difference from the above-described embodiment. Descriptions of matters similar to those of the above-described embodiment are omitted.

The electronic device according to the third embodiment of the invention is similar to that of the above-described first embodiment, excepting that the configuration of the sub-electrode terminal is different. Configurations similar to those of the above-described first embodiment are denoted by the same reference and numeral signs.

As shown in FIG. 10, in the electronic device 1 of the embodiment, the sub-electrode terminals 921 and 923 arranged in the y-axis direction are formed integrally with each other, and the sub-electrode terminals 922 and 924 are formed integrally with each other.

That is, the electronic device 1 of the embodiment has two sub-electrode terminals 925 and 926. The sub-electrode terminal 925 has the two circle contacting portions 921a and 923a each of which is a portion of the outline of the sub-electrode terminal, contacts the circle 300, and extends along the circumference of the circle 300. Similarly, the sub-electrode terminal 926 has the two circle contacting portions 922a and 924a each of which is a portion of the outline of the sub-electrode terminal, contacts the circle 300, and extends along the circumference of the circle 300. Moreover, the circle contacting portions 921a and 923a are arranged to face each other via the center O. Similarly, the circle contacting portions 922a and 924a are arranged to face each other via the center O.

Also in the third embodiment, effects similar to those of the above-described first embodiment can be provided.

2. Electronic Apparatus

The electronic device 1 described above can be incorporated into various kinds of electronic apparatuses. Examples of an electronic apparatus of the invention incorporating therein the electronic device 1 are not particularly limited, and include personal computers (for example, mobile personal computers), mobile terminals such as mobile phones, digital still cameras, inkjet discharge apparatuses (for example, inkjet printers), laptop personal computers, tablet personal computers, TV sets, video camcorders, videotape recorders, car navigation systems, pagers, electronic notebooks (including those with communication function), electronic dictionaries, calculators, electronic gaming machines, controllers for game, word processors, workstations, videophones, surveillance TV monitors, electronic binoculars, POS terminals, medical apparatuses (for example, electronic thermometers, sphygmomanometers, blood glucose meters, electrocardiogram measuring systems, ultrasonic diagnosis apparatuses, and electronic endoscopes), fishfinders, various kinds of measuring instrument, indicators (for example, indicators used in vehicles, aircraft, and ships), flight simulators, head-mounted displays, motion tracing, motion tracking, motion controllers, and PDR (pedestrian dead reckoning).

The substrate, the electronic device, and the electronic apparatus of the embodiments of the invention have been described so far based on the embodiments shown in the drawings. However, the invention is not limited to them, and the configuration of each of the portions can be replaced with any configuration having a similar function. Moreover, any another component or process may be added. Moreover, the substrate, the electronic device, and the electronic apparatus of the invention may be one obtained by combining any two or more configurations (features) of the embodiments.

In the above-described embodiments, the electronic device has the package accommodating the IC and the functional element. However, the electronic device is not limited to that as long as it has a plate-like base and external mounting terminals formed on a lower surface of the base, that is, as long as it has the substrate according to the invention. Accordingly, the electronic device may have a configuration in which, for example, an IC and a functional element are fixed to an upper surface of a base having external mounting terminals formed on its lower surface. In this case, the IC and the functional element may be molded from a mold material or the like, for example.

Moreover, in the above-described embodiments, a configuration has been described in which the IC and the functional element are accommodated in the package so as to overlap with each other in the thickness direction. However, the arrangement of them within the package is not limited to that. For example, the IC and the functional element may be arranged side by side (in the xy-plane direction) within the package.

Moreover, in the above-described embodiments, a configuration has been described in which only the gyro element is accommodated as a functional element within the package. However, the invention is not limited to that. For example, an acceleration detecting element or the like may be further accommodated.

Moreover, in the above-described embodiments, a configuration has been described in which all of the external mounting terminals having the circle contacting portions are sub-electrode terminals. However, the invention is not limited to that. One or all of the external mounting terminals having the circle contacting portions may be main electrode terminals (including ground electrodes).

Moreover, in the above-described embodiments, a case has been described in which the number of sub-electrode terminals is four. However, it is sufficient that the operational effects of the invention are derived, so that the number of sub-electrode terminals may be two, for example. In this case, the sub-electrode terminals 923 and 924, for example, can be omitted.

The entire disclosure of Japanese Patent Application No: 2011-168570, filed Aug. 1, 2011 is expressly incorporated by reference herein.

What is claimed is:

1. A substrate comprising:
   a base; and
   a plurality of bonding terminals arranged on at least one surface of the base, wherein
   the plurality of bonding terminals include a first bonding terminal and a second bonding terminal,
   the first bonding terminal and the second bonding terminal include, in plan view of the base, a circle contacting portion extending along a circumference of a circle tangent to the first bonding terminal and the second bonding terminal,
   all of the plurality of bonding terminals are arranged so as not to protrude from an area including the circle and an inside thereof, and
   the circle contacting portion includes at least a first circle contacting portion disposed in the first bonding terminal and a second circle contacting portion disposed in the second bonding terminal.

2. The substrate according to claim 1, wherein
   the first circle contacting portion and the second circle contacting portion are disposed point-symmetrically about a center of the circle.

3. The substrate according to claim 1, wherein
   the one surface of the base has four corner portions, and
   the first to the fourth circle contacting portions are disposed at the four corner portions of the base.

4. The substrate according to claim 1, wherein
   at least one of the circle contacting portions has a height above the base.

5. The substrate according to claim 1, wherein
   the base has a step portion which is a step relative to a recess outside the circumference of the circle and disposed at at least one portion of the circle on the circumference, and includes the circle contacting portion at at least one portion of the step portion.

6. The substrate according to claim 1, wherein
   a length of the circle contacting portion is from $1/100$ to $1/50$ of a length of the circumference of the circle.

7. The substrate according to claim 1, wherein
   at least one of the plurality of bonding terminals having the circle contacting portion is a dummy electrode terminal which is not electrically connected with at least one of an IC chip electrically connected with a functional element and a circuit disposed in a mounting board.

8. The substrate according to claim 1, wherein
   the plurality of bonding terminals include an electrode terminal which is electrically connected with a circuit disposed in a mounting board, and
   the electrode terminal is arranged at a location not contacting the circle on the one surface.

9. The substrate according to claim 1, wherein
   at least one of the plurality of bonding terminals having the circle contacting portion is an electrode terminal which is electrically connected with a circuit disposed in a mounting board.

10. An electronic device comprising:
    the substrate according to claim 1;
    a functional element disposed on another surface side of the substrate; and
    an IC chip disposed on the other surface side of the substrate and electrically connected with the functional element.

11. An electronic apparatus comprising the substrate according to claim 1 and a housing for supporting the substrate.

* * * * *